United States Patent [19]

Thornburg

[11] 4,121,153

[45] Oct. 17, 1978

[54] TAPERED RESISTOR METER

[75] Inventor: David D. Thornburg, Los Altos, Calif.

[73] Assignee: Xerox Corporation, Stamford, Conn.

[21] Appl. No.: 747,166

[22] Filed: Dec. 3, 1976

[51] Int. Cl.$^2$ ............................................. G01R 19/00
[52] U.S. Cl. ..................................... 324/96; 324/106; 73/356; 338/217; 350/351
[58] Field of Search ..................... 324/96, 106; 338/25, 338/217, 314; 73/356; 350/160 LC

[56] References Cited

U.S. PATENT DOCUMENTS

| | | | |
|---|---|---|---|
| 2,755,457 | 7/1956 | Diemer et al. | 324/96 UX |
| 3,149,281 | 9/1964 | Lieb | 324/96 |
| 3,244,979 | 4/1966 | Hershinger | 324/96 |
| 3,524,726 | 8/1970 | DeKoster | 324/96 UX |
| 4,006,414 | 2/1977 | Parker | 324/96 X |

FOREIGN PATENT DOCUMENTS 1,318,007  5/1973  United Kingdom ...................... 324/96

OTHER PUBLICATIONS

Schwartz et al., Indicator, IBM Technical Disclosure Bulletin, Aug. 1960, pp. 63 & 64.

*Primary Examiner*—Stanley T. Krawczewicz
*Attorney, Agent, or Firm*—James J. Ralabate; Sheldon F. Raizes; Leonard Zalman

[57] ABSTRACT

An improved analog meter is provided having no moving parts. This meter comprises a tapered resistor device having a tapered, electrically resistive element which develops a non-uniform temperature profile on electrical energization and a heat sensitive element operatively associated with the tapered resistive element. The heat sensitive medium employed is a reversible medium which either undergoes a change in color or contrast when heated to an appropriate temperature and when viewed under appropriate illumination. A method of metering employing this device is also disclosed.

1 Claim, 1 Drawing Figure

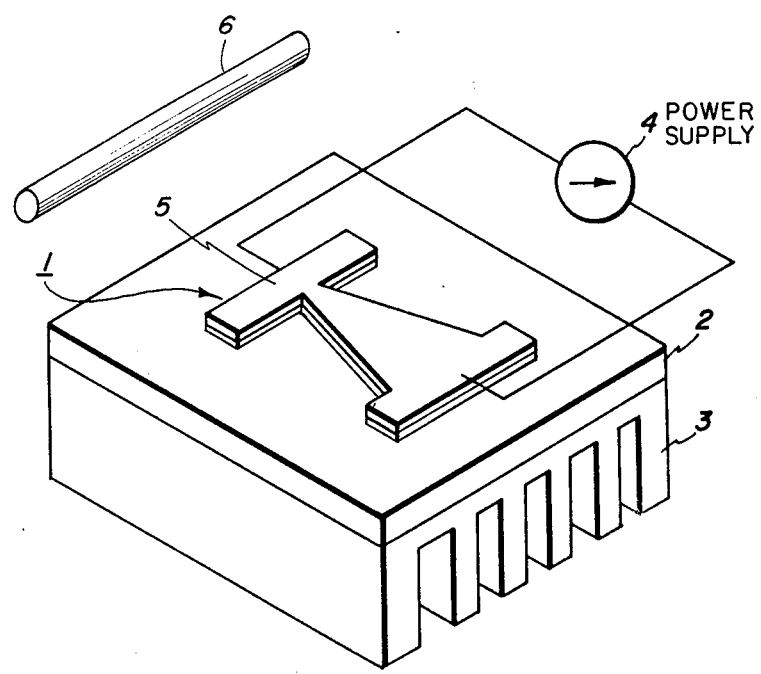

TAPERED RESISTOR METER

BACKGROUND OF THE INVENTION

This invention relates to metering devices and more specifically to a novel analog metering device having no moving parts.

Historically analog meters have been the mainstay of the meter measuring market by virtue of the fact that they involve low incident cost, are reliable, simple to manufacture, and are capable of supplying a continuous source of readings which are conventionally acceptable and desirable to those who employ them. The problems associated with the use of such conventional analog meters include: their inability to withstand rugged applications; and their inaccuracies when utilized in certain applications. With the advent of digital type devices the art became accustomed to direct readout devices which were more rugged than digital devices and therefore in most instances more dependable by virtue of the fact that they did not have moving parts and consequently required substantially less maintenance. However it is also well known that initially there was a great disparity in cost as between the analog and digital meters, i.e., initially digital meters were far more costly than analog meters, however during the growth and development of such technology this cost factor has become less pronounced and therefore digital meters are becoming more and more acceptable for many and varied applications. There are recent indications however that the measuring world seems to be reverting in substantial numbers back to the analog type devices for a number of reasons among which are: better readability with respect to visually observing trends and having an appreciation of relative magnitude of the measurement being made which is not possible with digital type meters in addition to the ever prevalent cost savings.

In response to this continuing need for analog type meters there has been made available commercially a number of analog meters which have no moving parts but which employ digital technologies to produce what appears to be analog indication in a metering type application. These hybrid devices are found to involve exhorbitant costs, and complexity of manufacture compared to either of the existing conventionally known analog and digital meters. There therefore seems to be a demonstrated need for continuing analog capability which has manifested itself in the marketplace in the form of a hybrid type meter having the aforementioned disadvantages.

There is therefore a demonstrated need to provide improved analog devices having no moving parts which will involve less maintenance, less cost of manufacture, more reliability, yet will still provide the technician or observer with the desirable analog type readings as above referred to.

It is therefore an object of this invention to provide a novel analog metering device devoid of the above noted deficiencies.

Yet another object of this invention is to provide an economical and easily maintainable analog novel metering device.

Yet still another object of this invention is to provide an analog metering device substantially having the advantages of digital type meters.

Yet still another object of this invention is to provide a novel analog metering system having no moving parts.

Again another object of this invention is to provide a novel metering system which is compact, easy to manufacture, and inexpensive to maintain.

Yet still another object of this invention is to provide a novel metering system which eliminates the need for complicated and expensive hybrid metering systems.

These and other objects of the instant invention are accomplished generally speaking by providing a tapered resistor element positioned on an insulating substrate which is suitably bonded to a heat sink. The tapered resistor element is then overcoated with heat sensitive media comprising materials which can be made to undergo a change in color or contrast when heated to an appropriate temperature and when viewed under appropriate illumination. Thus it is seen that now with the advent of tapered resistor technology innovative meters which are devoid of the deficiencies noted in both prior art digital and analog meters are now possible.

For example in U.S. Pat. No. 3,149,281 there is disclosed an electroluminescent voltage metering device having no moving parts as in the case of a tapered resistor metering device. However, there are significant distinguishable factors which are present and should be properly noted in order to properly define at least in part some of the advances made in the art: the device of the reference is far more complicated; it is restricted to the use of a certain phosphor or phosphors; and it would be far more expensive and complicated to manufacture.

This device generally comprises an apparatus for indicating the magnitude of an electric voltage in which two electrically conductive layers of which at least the one is optically transparent displays a range in the electroluminescent substance. At least one of these coatings has an electrical resistance of such a high value that upon application of a voltage at the one end of this resistance a light emission will at first substantially appear at this point and which with increasing voltage will continuously extend to further surface areas of the luminescent capacitor.

According to the invention a sharp boundary between the luminesced and the nonluminesced indicating area may be achieved by positioning between the two conductive coatings, an additional voltage dependent layer whose resistance is changed or varied abruptly at a predetermined voltage level. It is particularly advantageous to employ a material, such as cadmium sulfide which has the property of providing a voltage dependent resistance layer according to the patent.

In U.S. Pat. No. 3,244,979 a voltage indicating apparatus employing electroquenchable phosphor layers or layer is disclosed. As stated therein a layer composed of either of the phosphors cadmium sulfide and zinc cadmium sulfide is responsive to ultraviolet radiation incident thereon to emit visible light. The intensity of the light emitted by any region of such a phosphor layer can be reduced i.e., the phosphor can be quenched by applying a reverse biasing potential; a potential negative with respect to that of said region; to a rectifying connection to position over said region. Although the invention is not limited by any theory, the following is believed to be the explanation for this quenching. The aforementioned phosphors are $n$-type semiconductors which are excitable by ultraviolet radiation to produce whole electron pairs and emit visible light when these whole electron pairs recombine. However application of reverse biasing potential to a rectifying connection positioned over a region of the phosphor layer establishes an electric field within said region which attracts many of the holes generated by the ultraviolet radiation toward the rectifying connection, repels an equivalent number of electrons in said region away from the rectifying connection, and thus separates the holes and electrons in said region. This separation reduces markedly the number of recombination of holes and electrons within said region and therefore reduces markedly the intensity of visible light emitted thereby in response to ultraviolet radiation.

The voltage indicating apparatus of the invention comprises a layer of such an electroquenchable phosphor and conductive layers applied to opposing surfaces thereof in at least partial juxtaposition. One of these conductive layers is translucent to exciting radiation for example ultraviolet light. One is translucent to visible light emitted by the phosphor layer and one provides a rectifying connection to the phosphor layer. To excite the phosphor to emit visible light, means for example an ultraviolet emissive substance are provided for supplying radiant energy to the phosphor layer by way of the conductive layer translucent thereto. In addition means are provided for establishing a potential gradient along one conductive layer and for applying a potential to be measured to the other conductive layer. If this potential is intermediate to the minimum and maximum potentials applied to the opposing conductive layer, one region of the area rectifying connection provided by one or each conductive layer will be reverse biased, and concurrently another region thereof will be forward biased. The position of the boundary between the reverse biased and forward biased regions i.e., the position at which opposing portions of the two conductive layers are at the same potential, is determined by the magnitude of the applied voltage to be measured. The reverse biasing potential quenches only the portion of the phosphor layer lying beneath the reverse bias portion of the rectifying connection. Accordingly the position of the boundary between the luminesced and quenched areas of the phosphor layers indicates the magnitude of the applied voltage as the patent teaches.

Now with the advent of tapered resistor technology innovative meters which are far less complicated that those stated in the above patents and others have now been made possible.

Thus more specifically it can be seen that a meter employing such tapered resistor elements may be provided as follows: a tapered resistor element comprised of for example a nichrome tapered film is fabricated on an insulating substrate for example a borosilicate glass which is suitably bonded to an aluminum heat sink. A heat sensitive medium is then applied over the tapered resistor element for example, a cholesteric liquid crystal film is applied at least over the tapered resistor element. The particular cholesteric liquid crystalline material is chosen for conventionally known properties of such crystals which include providing a visible color change when heated to a specific temperature above ambient. The terminals of the tapered resistor are then connected to a current source to be measured. When the tapered resistor element is energized as explained above there is produced a temperature gradient and concurrent color changes in the cholesteric liquid crystalline material thus giving the meter reading.

Any suitable resistive film may be employed in the tapered resistor metering device of the instant invention. Typical resistive films include chromium, nichrome and nickel thin films as well as laminated foils of nichrome (a 80 Ni 20 Cr alloy), monel (a Cu,Ni alloy), Inconel (an alloy of nickel and chromium) on stainless steel. Any suitable insulating substrate may be employed in the metering system of the instant invention. Typical insulating materials include borosilicate glasses, ceramics, epoxy/glass composites, silicone rubbers, polyimides and polyethylene terephthalate.

Any suitable reversible material which can be made to undergo a change in color may be employed in the system of the instant invention. Typical materials which exhibit reversible color changes include a cholesteric liquid crystalline material, and $Cu_2HgI_4$, and intrinsic semiconductors including amorphous semiconducting glasses.

Any suitable material which undergoes a change in contrast when heated to an appropriate temperature and when viewed under appropriate illumination may be employed in accordance with the system of the instant invention. Typical materials which undergo a change in contrast at an appropriate temperature when viewed under appropriate illumination include: for example, thermally quenched phosphors, such as Radelin #1807, made by the U.S. Radium Corporation can be mixed with a suitable binder and made into a slurry which can be sprayed over the tapered resistance element to form a relatively thin film on the order of for example, $3 \times 10^{31\ 3}$ cm. The resultant film is found to fluoresce with a yellow light when illuminated with a long wavelength ultraviolet source. If the phosphor is then heated, the fluroescence is quenched and the phosphor turns dark.

Now with the advent of tapered resistor technology inexpensive analog meters may be provided which provide extremely desirable properties of both analog and digital meters known to the prior art. These devices incorporate and employ tapered resistance elements which develop a non-uniform temperature profile on electrical energization and are interacted after being energized with selected heat sensitive media to provide a number of very useful effects and devices which may be employed in a great many measuring applications as hereinabove described with ease, simplicity and greater economy than heretofore possible. The basis for this technology, the tapered resistor element is more specifically defined in U.S. Ser. No. 747,167 filed concurrently herewith (D/75554) which is hereby respectfully incorporated by reference.

Generally described therein, a conventional resistor device is seen to be a resistive film having a uniform thickness which has been formed into a resistor of a specified width and length. This film is then placed on an insulating substrate which is bonded to a heat sink. When an electrical current I is passed through the resistor the production of Joule heat causes a steady state temperature above ambient $\beta T$ which if thermal fringing effects are neglected may be theoretically defined by the relationship $$\Delta T = \frac{d_s I^2 \rho_s}{K_s W^2} \qquad \text{(Eq. 1)}$$

in which $d_s$ and $k_s$ are respectively the thickness and thermal conductivity of the substrate and $\rho_s$ is the sheet resistivity of the resistive material measured in ohms/-square. (Note: $\rho_s = \rho/d$ where $\rho$ is the bulk resistivity of the resistive material.) It is readily seen from this illustration that since the width of the resistor is uniform the local power dissipation and hence the temperature rise is also uniform so that no temperature gradient is established and the unique and utilizable effect of the device of the instant invention is not realized.

However, as is seen in FIG. 2 of U.S. Ser. No. 747,167, filed concurrently herewith (D/75554), a device may be provided including a resistive film whch significantly has a varying width in the horizontal plane while the thickness remains uniform. This film may be placed on an insulating substrate 2 which in turn is bonded to a heat sink 3. Now it is seen that the width of the resistive element 1 is a monotonically increasing function of position along the length of the element or in simple terms the resistive element is tapered. In the event the slope of the taper is gradual over distances comparable with the substrate thickness, equation 1 recited above will still be applicable for a first approximation. When a tapered resistor is energized the local power generation will vary along the length of the resistor so that points of prescribed temperature rise can be made to move along the tapered resistor by varying the current flowing through the device.

Although the non-uniformity of the width of the resistive film 1 may vary in any suitable fashion, it is assumed for purposes of this discussion that the taper is linear as is seen in FIG. 2 of U.S. Ser. No. 747,167 so that the following relationship is theoretically true: $w = w_o + bx$ $\phi < x < 1$ (Eq. 2) in which $w_o$ is the width at the narrow end of the tape, $b$ is the slope of the taper and $x$ is the distance along the resistor measured from the narrow end. Assuming that the tapered resistive element is in contact with for example a thermographic substance which undergoes a color change when heated to the temperature T' or above as the current is increased in the tapered resistor a color line of $x'$ will be drawn. The length of this line may theoretically be derived as follows: the temperature differential $\Delta T$ is defined as $\Delta T = T - T_{amb}$, where $T_{amb}$ is the ambient temperature. Combining equations 1 and 2 yields the relationship between the applied current and the distance $x'$ over which the tapered resistor will be heated to temperature T' or above, i.e., $$x' = \frac{I(d\rho_s/K_s\Delta T)^{1/2} - w_o}{b} \quad \text{(Eq. 3)}$$

It is seen that when $w_o$ is greater than zero no region of the taper will be hotter than T' for currents given by $$I \frac{w_o}{(d\rho_s/K_s\Delta T)^{1/2}} \quad \text{(Eq. 4)}$$

The general premise of the instant invention having been discussed and understood, the specifics of the system of the instant invention will be more clearly understood with reference to the drawings of which:

FIG. 1 is one embodiment of the meter of the instant invention.

In FIG. 1 is seen a heat sink 3 which has located thereover a thermally conducting substrate 2 having disposed thereover an electroded tapered resistive element 1. To the electrodes of the tapered resistive element 1 is electrically connected a power supply 4. A film 5 is applied over the surface of the tapered resistive element 1 which undergoes either a change in color or a change in contrast reversibly when sufficient heat is supplied from current source 4.

To further define the specifics of the present invention, the following examples are intended to illustrate and not limit the particulars of the present system. Parts and percentages are by weight unless otherwise indicated.

EXAMPLE I

A borosilicate glass microscope slide 1"×3"×0.03" is coated with a thin nichrome (80 wt % Ni 20 wt % Cr) film by conventional flash evaporation technique. A tapered resistor is defined in the nichrome film by conventional photolithography and etching to produce a TRE 2.5" long and which tapers linearly from 0.040 to 0.080" in width over its length. Electrodes are connected from an external variable power source to each end of the resistor. The resistance of the TRE is 680Ω. The TRE is then coated with a layer of an encapsulated cholesteric liquid crystal film which undergoes a visible color change over the temperature range from 80°–95° F. This film is held to the TRE by the adhesive backing which came with the liquid crystal film. The bottom surface of the substrate is bonded to an Al plate 0.125" thick with double sided adhesive tape. A colored line is seen to form in the liquid crystal layer when the applied voltage exceeds 18 volts. The length of this line is voltage dependent and covers the entire length of the TRE when the applied voltage reaches 30V. The colored line disappears when the voltage is removed.

Various other applications of the TRD of the instant invention may be applied by reference to the following illustrative examples:

1. The TRE of Example I is coated with Radelin #1807 thermographic phosphor dispersed in the weight ratios 20:10:11 of phosphor, Radelin binder and Radelin thinner which is then sprayed to a final film thickness of about 0.002". The resulting device is mounted on a heat sink as in Example 1 and exposed to illumination from a 4 watt long wavelength UV fluorescent lamp 6 as shown in the drawing. Under illumination, the phosphor glows yellow-green. As current is passed through the TRE, a dark line forms whose length varies linearly with applied current. This dark line results from the fact that as this phosphor is heated, its fluorescent intensity diminishes.

2. The TRE and a heat sink as in Example 1 is coated with a thin layer of $Cu_2HgI_4$ powder which has been dispersed in a suitable binder and solvent which is sprayed onto the TRE to a layer thickness of about 0.002". This layer is deep red and forms a black line when the TRE is biased. The length of this line will be proportioned to the current passing through the TRE.

Although the present examples were specific in terms of conditions and materials used, any of the above listed typical materials may be substituted when suitable in the above examples with similar results. In addition to the steps used to carry out the system of the present invention, other steps or modifications may be used if desirable. In addition, other materials may be incorporated in the system of the present invention which will enhance, synergize, or otherwise desirably affect the properties of the systems for their present use.

Anyone skilled in the art will have other modifications occur to him based on the teachings of the present invention. These modifications are intended to be encompassed within the scope of this invention.

What is claimed is:

1. An improved analog meter which has no moving parts and which is substantially electric field insensitive comprising:

a tapered resistor device comprised of (1) an electrically resistive element having a tapered form, and (2) a layer of a thermally quenched phosphor material operatively associated with said electrically resistive element, said phosphor material exhibiting a change in color contrast when it is both (*i*) heated beyond a threshold temperature and (*ii*) viewed under light of ultraviolet wavelength, means for coupling said electrically resistive element to a current surce, said electrically resistive element developing a non-uniform temperature profile on electrical energization due to its tapered form whereby said electrically resistive element heats a portion of said layer of phosphor material to beyond said threshold temperature, the magnitude of the portion of said phosphor heated to beyond said threshold temperature being related directly to the magnitude of the current from said current source, and means for illuminating said layer of phosphor material with light of ultraviolet wavelength whereby the portion of said phosphor heated to beyond said threshold temperature exhibits a color which is in contrast to the color of other portions of said layer of phosphor material such that the magnitude of the current from said current source is indicated.

* * * * *